(12) United States Patent
Gardner et al.

(10) Patent No.: US 6,194,768 B1
(45) Date of Patent: Feb. 27, 2001

(54) HIGH DIELECTRIC CONSTANT GATE DIELECTRIC WITH AN OVERLYING TANTALUM GATE CONDUCTOR FORMED ON A SIDEWALL SURFACE OF A SACRIFICIAL STRUCTURE

(75) Inventors: Mark I. Gardner, Cedar Creek; Frederick N. Hause; Charles E. May, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/177,867

(22) Filed: Oct. 23, 1998

(51) Int. Cl.$^7$ ................................................. H01L 31/119
(52) U.S. Cl. ......................... 257/410; 257/327; 257/344
(58) Field of Search ................................... 257/410, 411, 257/327, 288, 316, 319, 320, 344

(56) References Cited

U.S. PATENT DOCUMENTS

| | | |
|---|---|---|
| 4,120,700 | 10/1978 | Morimoto . |
| 4,495,219 | 1/1985 | Kato et al. . |
| 4,559,096 | 12/1985 | Friedman et al. . |
| 4,929,489 | 5/1990 | Dreschhoff et al. . |
| 5,070,046 | 12/1991 | Hu . |
| 5,111,355 | 5/1992 | Anand et al. . |
| 5,138,573 * | 8/1992 | Jeuch ..................................... 365/182 |
| 5,142,438 | 8/1992 | Reinberg et al. . |
| 5,186,718 | 2/1993 | Tepman et al. . |
| 5,246,884 | 9/1993 | Jaso et al. . |
| 5,281,554 | 1/1994 | Shimada et al. . |
| 5,304,503 | 4/1994 | Yoon et al. . |
| 5,427,968 * | 6/1995 | Hong ........................................ 437/43 |
| 5,552,337 | 9/1996 | Kwon et al. . |
| 5,677,015 | 10/1997 | Hasegawa . |
| 5,831,319 * | 11/1998 | Pan ......................................... 257/408 |
| 5,877,525 * | 3/1999 | Ahn ......................................... 257/321 |
| 6,004,850 * | 12/1999 | Lucas et al. ............................ 438/301 |
| 6,004,872 * | 12/1999 | Tezuka et al. .......................... 438/592 |
| 6,020,244 * | 2/2000 | Thompson et al. ................... 438/302 |

FOREIGN PATENT DOCUMENTS 0 540 993   5/1993   (EP) .

OTHER PUBLICATIONS

Yamada et al. "Gas Cluster Ion Beam Processing for ULSI Fabrication," Reprinted from Materials Research Society Symposium Proceedings vol. 427, *Advanced Metallization for Future ULSI*.

Raaijamakers "Low Temperature Metal—Organic Chemical Vapor Deposition of Advanced Barrier Layers for the Microelectronics Industry," *Thin Solid Films*, 247 (1994) pp. 85–93.

* cited by examiner

*Primary Examiner*—Sara Crane
(74) *Attorney, Agent, or Firm*—Kevin L. Daffer; Conley, Rose & Tayon

(57) ABSTRACT

A transistor is provided having a gate conductor produced with ultra fine geometries. The gate conductor is metallic and is sized using deposition rather than photolithography. The deposition process can be closely controlled to achieve gate lengths less than a few tenths of a micron. The metallic gate conductor serves to source metal atoms during anneal of lightly doped drain regions. The metal atoms migrate to the gate dielectric directly beneath the gate conductor to convert the gate dielectric to a high K dielectric. The high K dielectric is substantially resistant to breakdown yet enjoys the benefits of high speed operation and low threshold turn-on.

10 Claims, 4 Drawing Sheets

HIGH DIELECTRIC CONSTANT GATE DIELECTRIC WITH AN OVERLYING TANTALUM GATE CONDUCTOR FORMED ON A SIDEWALL SURFACE OF A SACRIFICIAL STRUCTURE

BACKGROUND OF THE INVENTION

1. Field of the Invention

This invention relates to integrated circuit fabrication and, more particularly, to forming a transistor upon a semiconductor substrate in which the gate length of a metal-based gate conductor which forms the transistor is dependent upon deposition rather than photolithography, and wherein the and the gate dielectric comprises a metal oxide having a relatively high dielectric constant.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Patterning the polysilicon material to form the gate conductor occurs by a process called photolythography. Typically, a photolythography mask is used to allow select removal of a light-sensitive material deposited entirely across a layer of polysilicon. The material which is exposed can, according to one embodiment, be polymerized and that which is not exposed removed. Selective polymerization is often referred to as the "develop" step of lithography. The regions which are non-polymerized are removed using the etch stage of lithography.

Conventional lithography used to pattern a gate conductor suffers many drawbacks. For example, selective exposure is highly dependent upon accurately placing light on the light-sensitive material. Furthermore, the light-sensitive material must consistently respond to the light with fine-line resolution. Any elevational disparity on which the polysilicon resides will result in slight changes in the point at which light impinges on the light-sensitive material. This results in a variation of the polymerized/non-polymerized boundary.

It would be advantageous to form a gate conductor without having to rely upon conventional lithographic patterning techniques. The impetus behind wanting to change gate formation methodology is principally driven from the smaller gate sizes of modern day integrated circuits. As gate lengths and widths become smaller to accommodate higher density circuits, it is necessary that the relatively small gate conductors be accurately produced with minimal misalignment or size variation. Any changes in the placement and geometry of a gate conductor can have negative performance effects on the ensuring MOS transistor.

Along with the benefits of increased density, reduction in the gate lengths and widths may further benefit the speed of the ensuing integrated circuit. Because of the increased desire to build faster and more complex integrated circuits, it has become necessary to reduce the turn on transistor threshold voltage, $V_T$. Several factors contribute to $V_T$, one of which is the gate-to-substrate capacitance. The higher the gate-to-substrate capacitance, the lower the $V_T$ of a transistor. The value of this capacitance is dependent upon the thickness of the gate oxide, and the relative permittivity of the gate oxide. Unfortunately, the relative permittivity, or dielectric constant, K, of the gate oxide limits the amount of gate-to-substrate capacitance that can be achieved when a transistor is in operation. Permittivity, $\epsilon$, of a material reflects the ability of the material to be polarized by an electric field. The capacitance between two layers of conductive material separated by a dielectric is directly proportional to the permittivity of the dielectric. The permittivity of a material is typically described as its permittivity normalized to the permittivity of a vacuum, $\epsilon_o$. Hence, the relative permittivity or dielectric constant of a material is defined as:

$$K=\epsilon/\epsilon_o$$

Since oxide (i.e., silicon dioxide) has a relatively low K of approximately 3.7 to 3.8, the minimum value of $V_T$, and thus the transistor switching speed must be somewhat sacrificed in order to promote capacitive coupling between the gate conductor and the substrate.

As mentioned above, the gate-to-substrate capacitance is also affected by the thickness of the gate oxide. Conventional transistors typically include an ultra thin gate oxide to reduce the gate-to-substrate capacitance, and thereby lower $V_T$. The value of the gate-to-source voltage, $V_{GS}$, required to invert the channel underneath the gate conductor such that a drive current, $I_D$, flows between the source and drain regions of the transistor is decreased. Consequently, the switching speed (from off to on and vice versa) of the logic gates of an integrated circuit employing such transistors is faster, allowing the integrated circuit to quickly transition between logic states (i.e., operate at high frequencies).

Unfortunately, thin oxide films may break down when subjected to an electric field. Particularly, for a gate oxide which is less than 50 Å thick, it is probable that when $V_{GS}$ is equivalent to only 3V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by e.g., dangling bonds. As a result, a net negative charge density may form in the gate oxide. As the trapped charge accumulates with time, $V_T$ may shift from its design specification. Breakdown of the gate oxide may also occur at even lower values of $V_{GS}$, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice. Low breakdown voltages also correlate with high defect density near the surface of the substrate.

In addition to advantages which might be gained in forming a gate conductor without relying on lithography limitations, it would be desirable to introduce a technique which can reduce gate-to-substrate capacitance so that the ensuing transistor is substantially resistant to gate dielectric breakdown. The improved technique would be one which avoids relatively thin gate oxide problems yet enjoys the advantage of a high speed operation necessary for modern integrated circuits. Tunneling currents formed between the gate dielectric and the gate conductor would be minimized along with a possibility of electrons becoming trapped within the gate dielectric. This affords an advantage in that the improved technique would produce a transistor that can operate at high speeds, is resistant to the limitations of photolithography as well as threshold skews from the desired $V_T$ value.

SUMMARY OF THE INVENTION

The problems outlined above are in large part solved by an improved transistor configuration hereof. The transistor can be either a p-channel or an n-channel transistor. The transistor is classified as one having a gate conductor formed outside the conventional lithography process. Instead of depositing a gate conductor material across an entire planar surface, the present process employs a gate conductor bounded in a localized region which extends from a lateral surface of a sacrificial structure. The bounded gate conductor can be formed by depositing a metallic or metal-based material across and adjacent to the sacrificial structure. That layer is than partially removed using an anisotropic etch technique, leaving a gate conductor adjacent only the sacrificial structure sidewall surfaces. The height of the sacrificial structure and the deposition thickness of the gate conductor material will define the entire gate conductor geometry. Following formation of the gate conductor, spacers can be formed on opposed lateral surfaces of the gate conductor. The spacer on one lateral surface can be of dissimilar thickness than the spacer on the opposed lateral surface. The transistor hereof is thereby classified possibly as an asymmetrical transistor, wherein the drain-side spacer can be made thicker in lateral dimension than the source-side spacer.

The present process utilizes a sacrificial material which is patterned to form the sacrificial structure. That structure is patterned at a specific location upon a dielectric-covered semiconductor substrate. The sacrificial structure is deemed "sacrificial" in that it is later removed from the dielectric-covered semiconductor topography. Once removed, the anisotropically etched gate conductor remains having one sidewall surface of the gate conductor aligned with a sidewall surface of what was once the sacrificial structure. Thus, the sacrificial structure sidewalls serve as a receptor against which a gate conductor is to be formed. The preferred deposition technique used to apply the gate conductor material includes sputter deposition or chemical-vapor deposition (CVD). In either instance, the thickness of the gate conductor material to some extent dictates the gate length of the gate conductor after the anisotropic etch step. The source-drain implant areas are then spaced from one another by a channel region determined by the lateral thickness of the gate conductor formed adjacent the sacrificial structure.

The gate conductor is formed by preferably depositing a metal material such as tantalum (Ta) across the upper and sidewall surfaces of the patterned sacrificial structure. An anisotropic etch, according to a preferred embodiment, comprises an ion-directed or ion-assisted plasma etch. The anisotropic etch removes the tantalum material from horizontal-extending surfaces and retains the tantalum on vertical surfaces (i.e., on sidewall surfaces of the underlying sacrificial structures.)

Of importance is the avoidance in using conventional lithography to define the gate geometry. Instead, the present process uses lithography only to define an edge (i.e., sacrificial material sidewall surface) of a gate conductor. Deposition and blanket anisotropic etchback is thereafter used to define the other edge of the gate conductor. As such, the present gate conductor is configured using primarily deposition techniques. Deposition determines the lateral extents and, therefore, the geometry of the ensuing gate conductor. Deposition can be more closely controlled to determine a finer resolution than what is currently available using conventional lithography. The present technique of forming a gate conductor can achieve gate lengths less than 0.3 microns, and in many instances less that 0.2 microns.

The metal or metal-based material which forms the gate conductor is preferably tantalum. However, other metals may be used provided the metal chosen reacts with the underlying gate dielectric. Preferably, the metal gate conductor patterned against the sacrificial structure sidewall surface will react with the underlying oxide used to form the gate dielectric. If the metal gate conductor is tantalum, tantalum atoms migrate from the gate conductor structure and combine with oxygen atoms within the thermally grown or deposited gate dielectric. At least a portion of, and possibly the entire thickness of, the gate dielectric is consumed by tantalum and is converted to tantalum pentoxide ($Ta_2O_5$). Tantalum pentoxide will then serve as the gate dielectric. Of benefit, tantalum pentoxide is a high K dielectric having a dielectric constant greater than 3.8 and roughly greater than 15. It is believed that tantalum pentoxide thickness greater than several hundred angstroms will achieve capacitive coupling performance equivalent to less than 20 angstroms of $SiO_2$. This allows the gate dielectric to operate in a high performance range but without suffering the consequences of threshold skew or breakdown normally attributed to thin gate oxides of equivalent performance.

The high K gate dielectric is formed concurrent with anneal of a previously implanted lightly doped drain (LDD). Using the metal gate conductor as a mask, LDD species are implanted into the semiconductor substrate on opposite sides of the channel area. To activate the LDD implanted areas, an anneal step is used which simultaneously anneals the LDD implants while causing metal atoms to migrate from the metal conductors to the underlying gate dielectric. The migratory metal atoms form the high K gate dielectric and the benefits thereof.

The advantage of activating LDD implants concurrent with forming the high K gate dielectric is carried out with minimal modification to conventional processing steps. Additionally, metal atoms within the metal gate conductor serves as a barrier against subsequently implanted n-type or p-type species. More specifically, the metal atoms within the gate conductor serve to prevent LDD and/or source/drain implants from extending through the gate conductor to the underlying channel region. Accordingly, the metal gate conductor proves advantageous over conventional polysilicon gate conductors.

Broadly speaking, a method is presented for forming a transistor. The method includes forming a metal-based gate conductor upon an oxide gate dielectric and adjacent to a sidewall surface of a sacrificial structure. Thereafter, the sacrificial structure can be removed. The remaining metal-based gate conductor can then be heated to diffuse metal or metallic atoms from the metal-based gate conductor to the underlying oxide gate dielectric.

According to one embodiment, the metal-based gate conductor includes tantalum. A layer of tantalum is deposited across the semiconductor topography, including the sacrificial structure and the oxide gate dielectric. Thereafter, the layer of tantalum is directionally removed, leaving the metal-based gate conductor upon the oxide-based gate dielectric and extending a specified distance from only the sidewall surfaces of the sacrificial structure.

According to another embodiment, a first dopant (or LDD implant) is forwarded into the semiconductor substrate outside a perimeter of the metal gate conductor. Accordingly, the metal gate conductor serves as a mask to define LDD regions within the semiconductor substrate. The LDD dopants are than annealed by subjecting the entire semiconductor topography to a heat cycle. The heat cycle not only activates the LDD dopants and repairs implant damage, but also causes metallic species within the metal gate conductor to migrate into the gate dielectric beneath the metal gate conductor.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
FIG. 1 is a partial cross-sectional view of a semiconductor topography, wherein a layer of oxide is formed upon a semiconductor substrate according to an initial processing step.

Turning to the drawings, FIG. 1 illustrates a semiconductor topography 20 which comprises a semiconductor substrate 26. Semiconductor substrate 26 is preferably made of single crystalline silicon. Although not shown in the depicted cross-section of substrate 26, dielectric isolation regions, such as trench isolation structures may be arranged spaced distances apart within the substrate for dielectrically isolating ensuing active areas.

Deposited entirely across substrate 26 is a dielectric 28. Dielectric 28 is either deposited, or grown from a heated, oxygen-bearing source. Nitrogen may be included with the source material so that, if desired, dielectric layer 28 includes a nitrogen component useful as a barrier species. The barrier proves useful to prevent metal atoms subsequently formed within the gate dielectric region of dielectric 28 from migrating downward into the ensuing channel.

Figure 2:
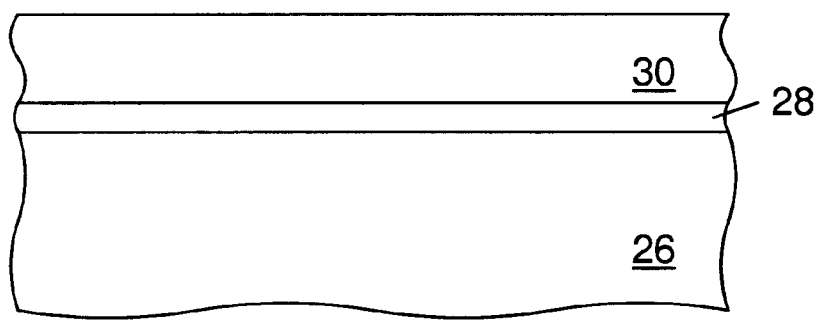
FIG. 2 is a partial cross-sectional view of the semiconductor topography, wherein a layer of a sacrificial material is deposited upon the layer of oxide according to a processing step subsequent to FIG. 1.

Referring to FIG. 2, a layer of sacrificial material 30 is deposited entirely across dielectric 28. Sacrificial material 30 may be a dielectric, and preferably includes any dielectric material which can be chemical vapor deposited and of dissimilar composition from dielectric 28. According to one example, sacrificial material 30 comprises nitride, and dielectric 28 comprises oxide.

Figure 3:
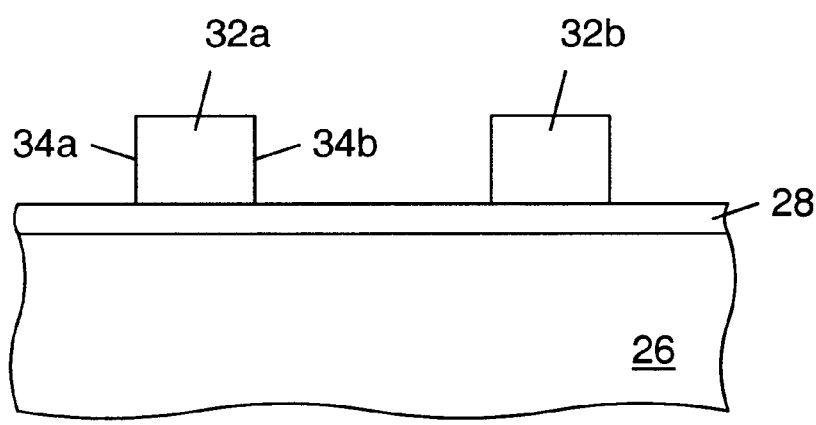
FIG. 3 is a partial cross-sectional view of the semiconductor topography, wherein the layer of sacrificial material is patterned according to a processing step subsequent to FIG. 2.

Referring to FIG. 3, sacrificial material 30 (FIG. 2) is removed to form at least one sacrificial structure 32a. Another sacrificial structure 32b (and certainly more) is patterned a spaced distance from sacrificial structure 32a. Lithography techniques are used to selectively remove the sacrificial material, leaving sacrificial structures 32 in select regions upon gate dielectric 28. A photoresist layer may therefore be used to expose portions of the sacrificial layer of material. An etchant is chosen which is selected to remove material 30 but not the underlying gate dielectric. For example, the etchant may be a wet etchant chosen for its selectivity to remove nitride in lieu of oxide. Alternatively, the etchant can be a plasma etchant which is directionally driven perpendicular to the upper surface of dielectric 28. The plasma etchant may be less selective but produces a more vertical sidewall surface. It is desirable, therefore, that opposed sidewall surfaces 34a and 34b of each sacrificial structure be somewhat vertical in its orientation. This lends itself more easily to forming a gate conductor adjacent that vertical surface during anisotropic etchback described in reference to FIGS. 4 and 5.

Figure 4:
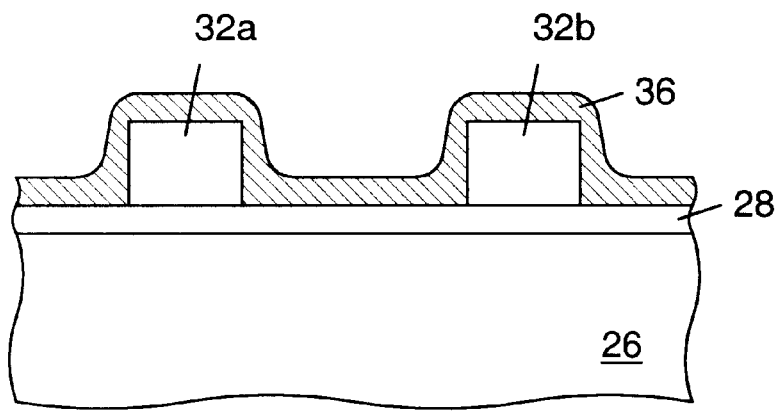
FIG. 4 is a partial cross-sectional view of the semiconductor topography, wherein a layer of metal-based material is deposited upon the patterned layer of sacrificial material according to a processing step subsequent to FIG. 3.
Figure 5:
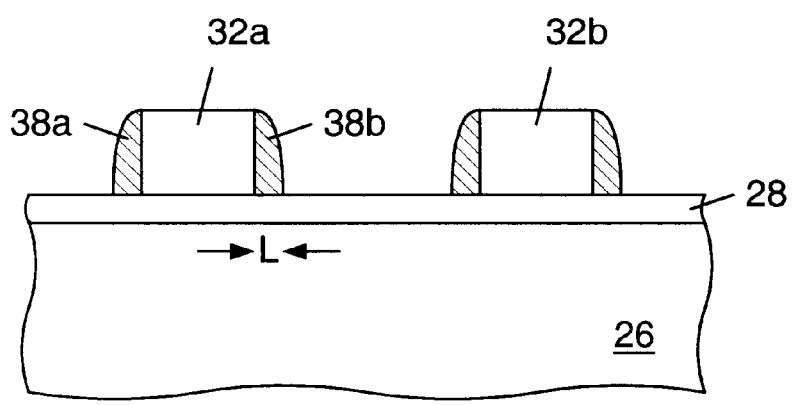
FIG. 5 is a partial cross-sectional view of the semiconductor topography, wherein the layer of metal-based material is directionally removed to form spaced pairs of metal-based structure according to a processing step subsequent to FIG. 4.

Turning to FIG. 4, a metal-based material 36 is blanket deposited across the exposed upper topography, including sacrificial structures 32 and gate dielectric 28. Metal layer 36 can be either chemical vapor deposited or, more preferably, sputter deposited to a specified thickness within the range of, e.g., 0.2 to slightly over 1.0 micron. The thickness of layer 36 will ultimately determine the gate length of the gate conductor 38 shown in FIG. 5. More specifically, gate conductors 38a and 38b formed on each sacrificial structure 32 are formed by anisotropically removing portions of metal layer 36. Removing portions of layer 36 involves anisotropically etching the layer using a plasma etch employing both physical and chemical removal mechanisms. Ions are bombarded at an angle substantially perpendicular to the upper surface of gate dielectric 28. This causes substantially horizontal surfaces of metal layer 36 to be removed faster than substantially vertical surfaces. Accordingly, anisotropic etching retains regions of layer 36 extending outward from vertical surfaces to form gate conductors 38a and 38b. The extent at which those regions laterally extend is defined as the gate length. Since a portion of the thickness adjacent the sacrificial structure sidewall surfaces are removed, the original thickness is reduced adjacent the vertical surfaces to produce a gate length less than 0.3 microns, and preferably less than 0.2 microns. The thickness herein defined as gate length L, is thereby determined by the deposition thickness of layer 36, the height of sacrificial structure 32, and the duration needed to remove material 36 from the upper surface of the sacrificial structures 32 (as well as upper surfaces of dielectric 28 spaced from sacrificial structures 32).

Figure 6:
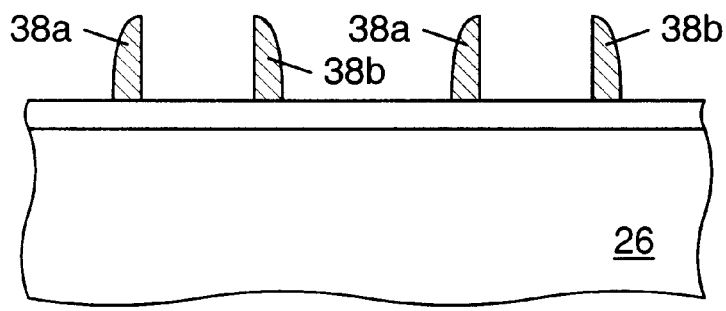
FIG. 6 is a partial cross-sectional view of the semiconductor topography, wherein the patterned layer of sacrificial material is removed from between the metal-based structures according to a processing step subsequent to FIG. 5.

The definition of structures 32 being "sacrificial" lends themselves to being easily removed separate from gate conductors 38 and underlying gate dielectric 28. As shown in FIG. 6, sacrificial structures 32 are removed using a wet etch chemistry selective, for example, to remove nitride instead of metal gate conductors 38a and 38b and oxide gate dielectrics 28. Removing sacrificial structures 32 presents gate conductors 38a and 38b spaced a pre-defined distance apart dictated by the lateral extents of sacrificial structures 32. That pre-defined spacing may serve as a common drain in, for example, a series-connected pair of transistors typically associated with logic gates or inverters.

Figure 7:
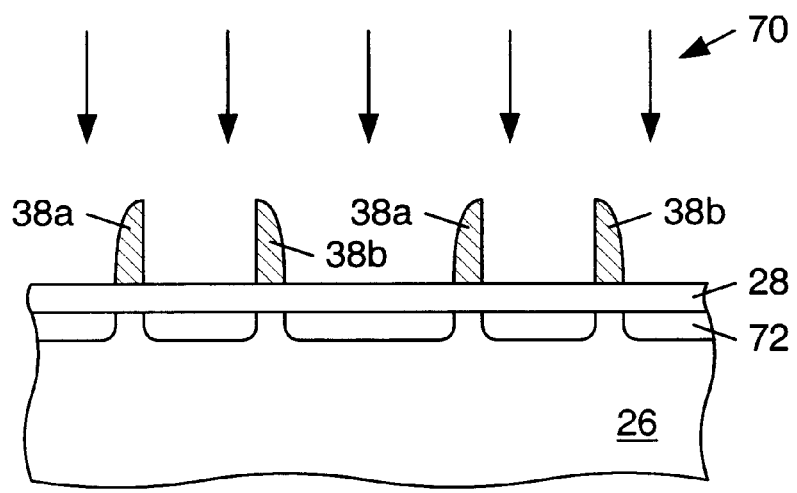
FIG. 7 is a partial cross-sectional view of the semiconductor topography, wherein lightly doped drain (LDD) regions are formed within the semiconductor substrate and aligned to lateral edges of the metal-based structures according to a processing step subsequent to FIG. 6.

FIG. 7 indicates an initial (or first) implant step 70 of a first dopant placed within substrate 26. Portions of implant 70 are masked by gate conductors 38 to selectively form LDD implant regions 72 within substrate 26. The LDD regions are shown self-aligned with lateral extents of gate conductors 38. Gate conductors 38 thereby define the channel separation between LDD areas 72.

Figure 8:
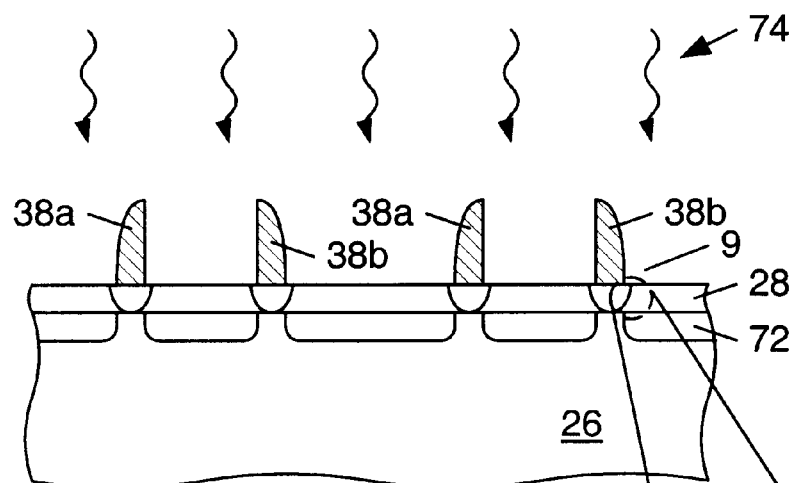
FIG. 8 is a partial cross-sectional view of the semiconductor topography, wherein a metallic element within the metal-based structures cross-diffuse with oxygen within the oxide gate dielectric to form a metal-based gate conductor upon a high K gate dielectric according to a processing step subsequent to FIG. 7.

FIG. 8 illustrates exposure of a semiconductor topography to thermal radiation 74. The ambient in which the topography is placed is preferably inert, possibly containing nitrogen species. In this manner, nitrogen atoms may diffuse into the gate dielectric 28 where they fill vacancy and interstitial positions. Thermal radiation 74 can be derived from an anneal chamber used to activate dopants within LDD regions 72 concurrent with downward diffusion of mobile metal atoms from gate conductor 38 into gate dielectric 28. The added heat causes metal atoms to diffuse into the gate dielectric where they fill vacancy and interstitial positions therein.

Figure 9:
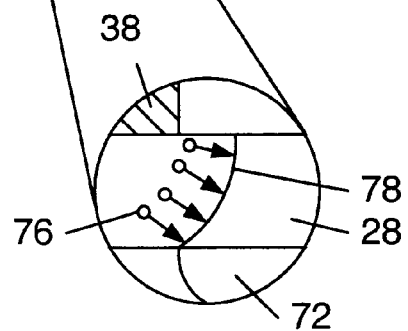
FIG. 9 is a detailed view along region 9 of FIG. 8, showing migration of the metallic element aligned with a lateral edge of the LDD region according to one embodiment.

As shown in FIG. 9, a detailed view along region 9 of FIG. 8 indicates movement of metal atoms 76 from their positions within gate conductor 38 downward into gate dielectric 28. The amount of diffusion, or diffusion length, can be adjusted based on the duration of the temperature cycle. According to one embodiment, the diffusion length is adjusted so that the maximum diffusion length does not extend beyond boundary 78. Boundary 78 buttresses with the inward-extending lateral edge of LDD region 72 at the interface between the substrate and the overlying gate dielectric. In this fashion, when the non-metal regions of gate dielectric 28 are subsequently removed, the edge of the remaining metal regions of gate dielectric 28 align with the edge of the LDD implant to allow only the metal indoctrinated gate dielectric to reside upon the channel between LDD area 72.

Figure 10:
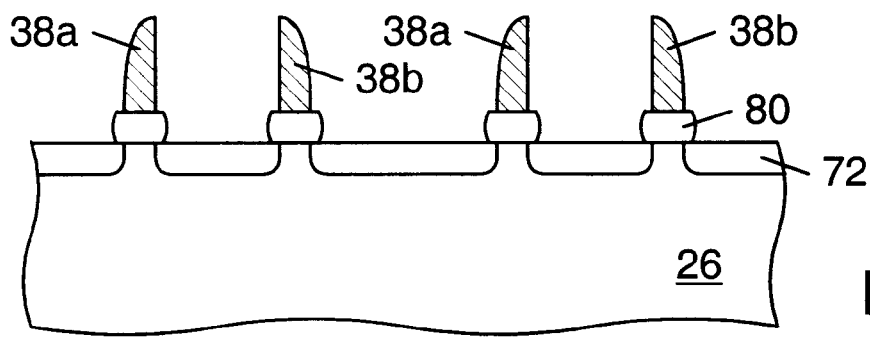
FIG. 10 is a partial cross-sectional view of the semiconductor topography, wherein the regions of the oxide gate dielectric which have not received the metallic element area removed according to a processing step subsequent to FIG. 9.

FIG. 10 illustrates a procedure of removing the nonmetal-indoctrinated gate dielectric regions using an etch which is selective to oxide but not necessarily to oxide having metal atoms. According to one embodiment, the etch is selective to $SiO_2$ rather than $Ta_2O_5$. To further aid in this selectivity, the etchant will only attack that which is exposed, and certainly not the metal-indoctrinated gate dielectric residing directly beneath gate conductors 38. The remaining gate dielectric is shown as reference numeral 80 having a substantial metal constituent.

Figure 11:
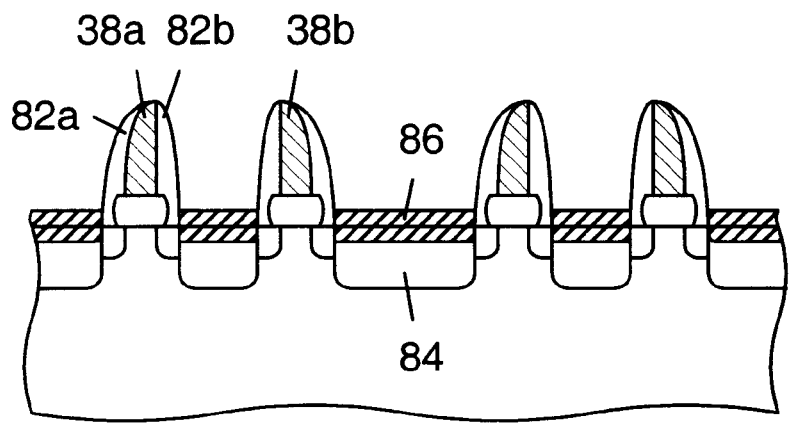
FIG. 11 is a partial cross-sectional view of the semiconductor topography, wherein spacers are formed on opposed sidewall surfaces of the metal-based gate conductors to form series connected transistor pairs.

FIG. 11 illustrates the culmination of many steps. First a dielectric material, such as oxide or nitride may be chemical-vapor deposited across exposed portions of the upper topography, including structures 72, 80, and 38. Anisotropic etch in which ion ablation occurs to remove the dielectric material from horizontal surfaces, leaving spacers 82 on opposed sidewall surfaces of each gate conductor 38. Subsequently, a heavy concentration source/drain implant is self-aligned to the exposed lateral surfaces of the dielectric spacers 82. During this implantation step, dopants are also forwarded into gate conductors 38. However, since the gate conductor is made of metal, the dopants do not traverse the gate conductor and enter the underlying channel regions. As such, problems associated with polysilicon gate conductors are avoided. Those problems include, for example, polysilicon depletion as the dopants residing within the gate conductor eventually traverse the gate conductor and skew threshold voltages when they enter the channel area. Metal atoms within the metal gate conductor prevent the depletion problem.

The dopants used for the source/drain implant are the same type as that used by the LDD implant. Preferably, if a p-channel transistor is being formed, ion implantation of p-type species is used. Some commonly used n-type dopants are arsenic or phosphorous, and some commonly used p-type dopants are boron or boron diflouride. The resulting transistor has greater junctions in which dopant concentration increased laterally in a direction away from gate conductor 38. The transistor has a relatively thick gate dielectric with a relatively high K value such that it provides good gate-to-substrate capacative coupling without breakdown problems.

Once spacers 82 are produced, and source/drain regions 84 are formed between spacers 82, a silicide 86 can be grown on exposed silicone-based surfaces. The silicide includes any refractory metal which reacts with the substrate upper surfaces primarily within the source/drain regions 84. Suitable refractory metals include titanium or cobalt. Spacers 82 contain sufficient oxygen atoms to prevent silicide formation thereon. Source/drain regions 84 are preferably a contiguous implant region, serving as a direct conducted path between one transistor junction and the adjacent transistor junction. Patterning a sacrificial structure and then removing that structure to allow a contiguous junction region lends itself readily to a series-connected pair of transistors coupled between, e.g., a power supply in ground. Such series-connection is prevalent in numerous circuit designs.

It will be appreciated to those skilled in the art having the benefit of this disclosure that the present transistor structure, and the method of forming the transistor structure, is believed to provide benefits over conventional photolithography used in forming gate conductors and a further benefit over conventional polysilicon gate conductors. Yet further, the present transistor can be achieved having a high K gate dielectric which is resistant to breakdown but achieves high performance characteristics. The gate dielectric occurs as a result of the anneal process used to electrically activate LDD dopant regions. It is intended that the following claims be interpreted to embrace various modifications and changes and, accordingly, the specification and drawings are to be regarded in an illustrative rather than a restrictive sense.

What is claimed is:

1. A transistor, comprising metal atoms within a gate dielectric interposed between a metal gate conductor and a channel region, wherein said metal gate conductor comprises first and second opposed sidewall surfaces, wherein said first sidewall surface is substantially perpendicular to an upper surface of said gate dielectric, and wherein said second sidewall surface has an arcuate shape.

2. The transistor as recited in claim 1, wherein the metal atoms within the gate dielectric arise from tantalum atoms within the metal gate conductor.

3. The transistor as recited in claim 1, wherein said gate conductor comprises tantalum and said gate dielectric comprises tantalum pentoxide.

4. The transistor as recited in claim 1, wherein the gate length of the metal gate conductor is less than 0.3 microns.

5. The transistor as recited in claim 1, wherein the channel region resides within a semiconductor substrate between a pair of junctions.

6. The transistor as recited in claim 1, further comprising a metal silicide residing upon and within an upper surface of the pair of junctions.

7. The transistor as recited in claim 1, further comprising LDD regions, wherein the LDD regions are self-aligned to the opposed sidewall surfaces of the metal gate conductor.

8. The transistor as recited in claim 1, further comprising spacers upon the opposed sidewall surfaces of the metal gate conductor.

9. The transistor as recited in claim 1, further comprising source/drain regions self-aligned to exposed lateral surfaces of the spacers.

10. The transistor as recited in claim 1, wherein a gate length of the metal gate conductor is determined by a deposition thickness of a metal deposited upon a sacrificial structure, a height of the sacrificial structure, and a time needed to remove the deposition thickness of the metal from an upper surface of the sacrificial structure.

* * * * *